(12) United States Patent
Rousselin et al.

(10) Patent No.: US 6,408,167 B1
(45) Date of Patent: Jun. 18, 2002

(54) RADIO DEVICE INCLUDING A RECEIVER AND METHOD OF ADJUSTING ONE OF THE HIGH-FREQUENCY AMPLIFIER STAGES OF A RECEIVER

(75) Inventors: Samuel Rousselin, Rennes; Luigi DiCapua, Caen, both of (FR)

(73) Assignee: Koninklijke Philips Electronisc N.V., Eindhoven (NL)

( * ) Notice: Subject to any disclaimer, the term of this patent is extended or adjusted under 35 U.S.C. 154(b) by 0 days.

(21) Appl. No.: 09/289,846

(22) Filed: Apr. 12, 1999

(30) Foreign Application Priority Data

Apr. 16, 1998 (FR) .............................................. 98 04730

(51) Int. Cl.[7] .............................. H04B 1/18; H04B 17/00
(52) U.S. Cl. ................................... 455/193.1; 455/226.2
(58) Field of Search ........................... 455/193.1, 193.2, 455/193.3, 180.4, 184.1, 191.1–191.3, 197.2, 226.1, 226.2, 67.4

(56) References Cited

U.S. PATENT DOCUMENTS

| | | | |
|---|---|---|---|
| 5,524,288 A | * | 6/1996 | Monge Navarro et al. ...... 455/193.2 |
| 5,548,821 A | * | 8/1996 | Covely .................... 455/193.2 |
| 6,058,294 A | * | 5/2000 | Bruwer et al. .............. 455/119 |
| 6,081,700 A | * | 6/2000 | Salvi ....................... 455/193.3 |

FOREIGN PATENT DOCUMENTS

| | | | |
|---|---|---|---|
| EP | 0546723 A1 | 6/1993 | ............ H04B/1/10 |
| JP | 4-48827 | * 2/1992 | ............ 455/193.3 |
| JP | 4-150421 | * 5/1992 | ............ 455/193.1 |
| JP | 4-243327 | * 8/1992 | ............ 455/193.1 |
| JP | 07022974 A | 1/1995 | ............ H04B/1/16 |

* cited by examiner

Primary Examiner—Nguyen T. Vo
(74) Attorney, Agent, or Firm—Jack D. Slobod

(57) ABSTRACT

A radio device includes a receiving part (45) formed by a high-frequency selective amplifier stage (50) including a frequency selective circuit (51) having a plurality of capacitive elements (68–78), any one or more which can be selectively connected into the selective circuit in dependence on a control magnitude stored in a storage element (90) in order to tune the selective circuit to a certain frequency. Under the control of a microprocessor (92) the stored control magnitude is set to that which gives the best level measured by a level detector (98) at the output of the amplifier stage. The microprocessor varies the control magnitude to produce a series of alternate connections into the selective circuit of each and every combination of one or more of the reactive elements, receives the measurement by the level detector of the level at the output of the amplifier stage or each control magnitude, and selects the control magnitude giving the best level.

5 Claims, 2 Drawing Sheets

RADIO DEVICE INCLUDING A RECEIVER AND METHOD OF ADJUSTING ONE OF THE HIGH-FREQUENCY AMPLIFIER STAGES OF A RECEIVER

BACKGROUND OF THE INVENTION

The present invention relates to a radio device comprising a receiving part formed by at least:

a selective high-frequency amplifier stage including a selective circuit that can be tuned to a certain tuning frequency.

The invention also relates to a method of adjusting one of the high-frequency amplifier stages included in such a device.

Such devices are well known and find many applications, notably in the field of portable telephones. It is necessary for this type of device to have a sensitive receiver that increases its range. The use of a selective amplifier improves the sensitivity.

A problem posed with such devices is the tuning of this selective amplifier. During manufacture, components are used whose values feature certain dispersion. One is thus confronted with the fact that the tuning frequency of the selective amplifiers varies from one specimen to the other at the end of the manufacture and also varies in dependence on temperature. To compensate this, habitually an adjusting capacitor is provided and its value is influenced so that the selective circuit is well tuned to the frequency band in which it is to operate. A temperature compensation is described in Japanese patent specification no. 07022974 of 24.01.1995. This compensation acts on a variable capacitance diode that also tunes the oscillation circuit, so that the total variation that can be applied to this diode is burdened with this compensation.

SUMMARY OF THE INVENTION

The present invention proposes a device of the type defined in the opening paragraph in which means are provided for facilitating the tuning of the selective stage without using notably the temperature meter and means for maintaining the voltage dynamic that can be applied to the tuning voltage if the selective circuit requires a certain dynamic in the tuning of its selective circuit. Therefore, such a device is characterized in that it comprises:

a received level meter for measuring the received level of the signals transmitted by a reference oscillator, a variation element for causing the tunable band-pass circuit to vary as a function of a control magnitude, a storage element for storing the control magnitude that gives the best level obtained by the level meter.

One of the ideas of the invention is to insert into the selective circuit one or various reactive elements that enable to center this selective circuit on the frequency range in which the device is supposed to operate.

These and other aspects of the invention are apparent from and will be elucidated, by way of non-limitative example, with reference to the embodiments described hereinafter.

DETAILED DESCRIPTION OF THE PREFERRED EMBODIMENTS

Figure 1:
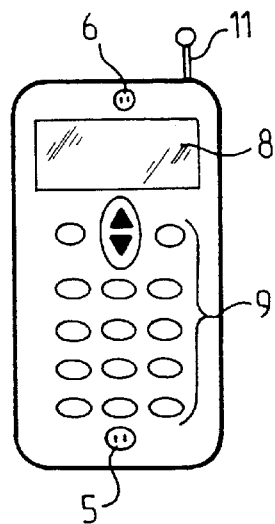
FIG. 1 shows a device in accordance with the invention.

In FIG. 1 is represented an electronic device in accordance with the invention. Within the framework of the described example, this is a wireless electronic device, for example, of the CTO type. It comprises a microphone 5, an earphone 6, a display 8, a keyboard 9 and an antenna 11. This device is connected to its base station (not shown in the FIG.) by utilizing a frequency channel. It is to be observed that the invention may also be applied to the base station itself.

Figure 2:
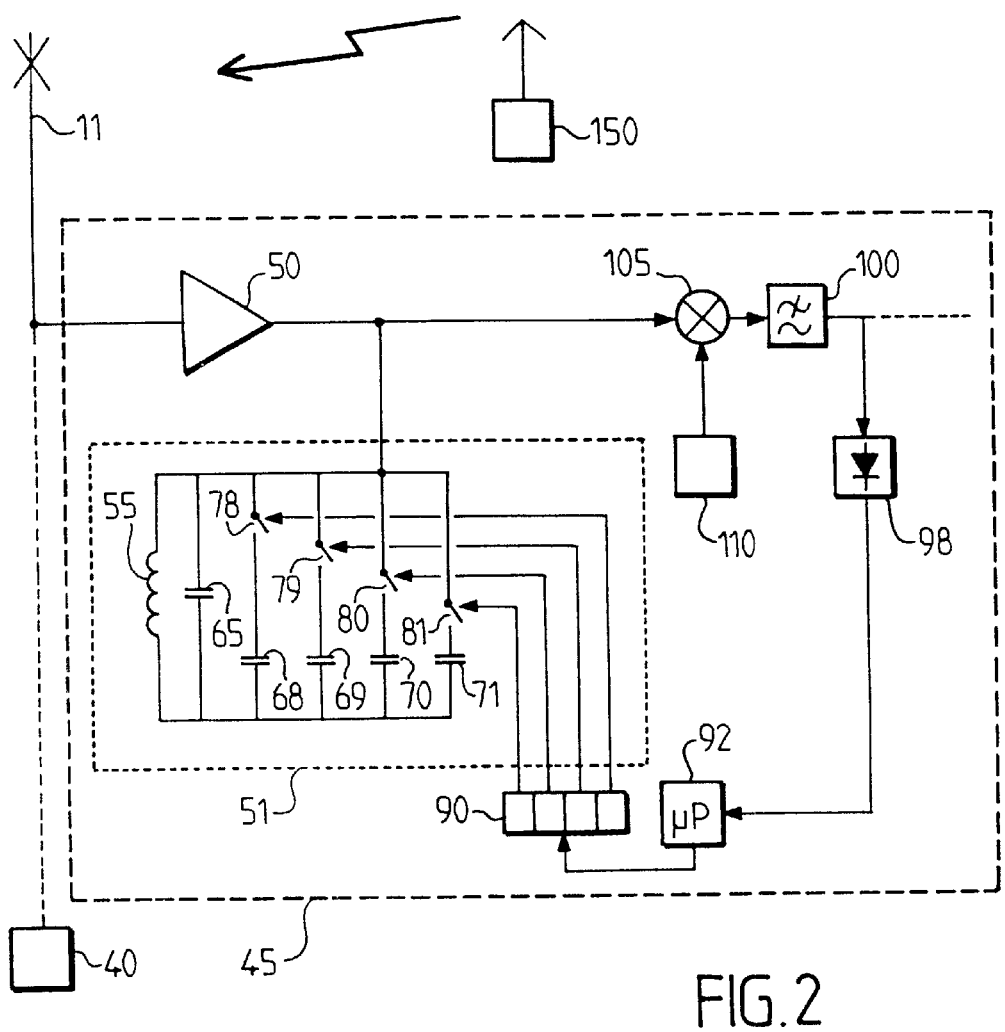
FIG. 2 shows the detail of embodiment of the invention.

FIG. 2 shows the transmitting part 40, not in detail because it does not form part of the invention, and the receiving part 45. It is in this receiving part that the selective amplifier is located which is the high-frequency preamplifier. This amplifier is shown diagrammatically in this Figure. by an actual amplifier 50, at the output of which a selective anti-resonant circuit 51 is provided. This anti-resonant circuit is formed by a self-inductance coil 55 to the ends of which a main capacitor 65 is connected which sets in a first approximation the tuning frequency of this anti-resonant circuit. This capacitor may also be a varicap diode.

According to the invention, for making the tuning frequency of this selective circuit vary, other capacitors 68, 69, 70 and 71 are provided. For this purpose, they can be connected in parallel with the main capacitor 65 via a connection circuit formed by the switch circuit 78, 79, 80 and 81 respectively. The open or closed position of these switch circuits is determined by the contents of a counter 90. The contents of this counter 90 are incremented under the control of a microprocessor 92 and this counter 90 is also reset to zero under the control of this microprocessor 92. Thus, the assembly formed by the capacitors 68, 69, 70 and 71 and the switch circuits 78, 79, 80 and 81 forms an element for varying the tuning frequency controlled by the contents of the counter 90. This microprocessor also receives a signal coming from a level detector 98. This level detector 98 is connected to the output of a medium frequency filter 100. This filter shows a medium frequency signal obtained by a mixer 105, which performs the mixing of the signals supplied by the selective amplifier 50 including the anti-resonant circuit 51 and a local oscillator 110. For adjusting the capacitance to be connected in parallel with the main capacitor 65, a reference transmitter 150 is used. The various capacitors are connected in turn in parallel with the anti-resonant circuit 51, thereby forming a tunable band-pass filter circuit. The combination applied to this anti-resonant circuit 51 that offers the best-received level is stored, for example, by freezing the contents of the counter 90.

Figure 3:
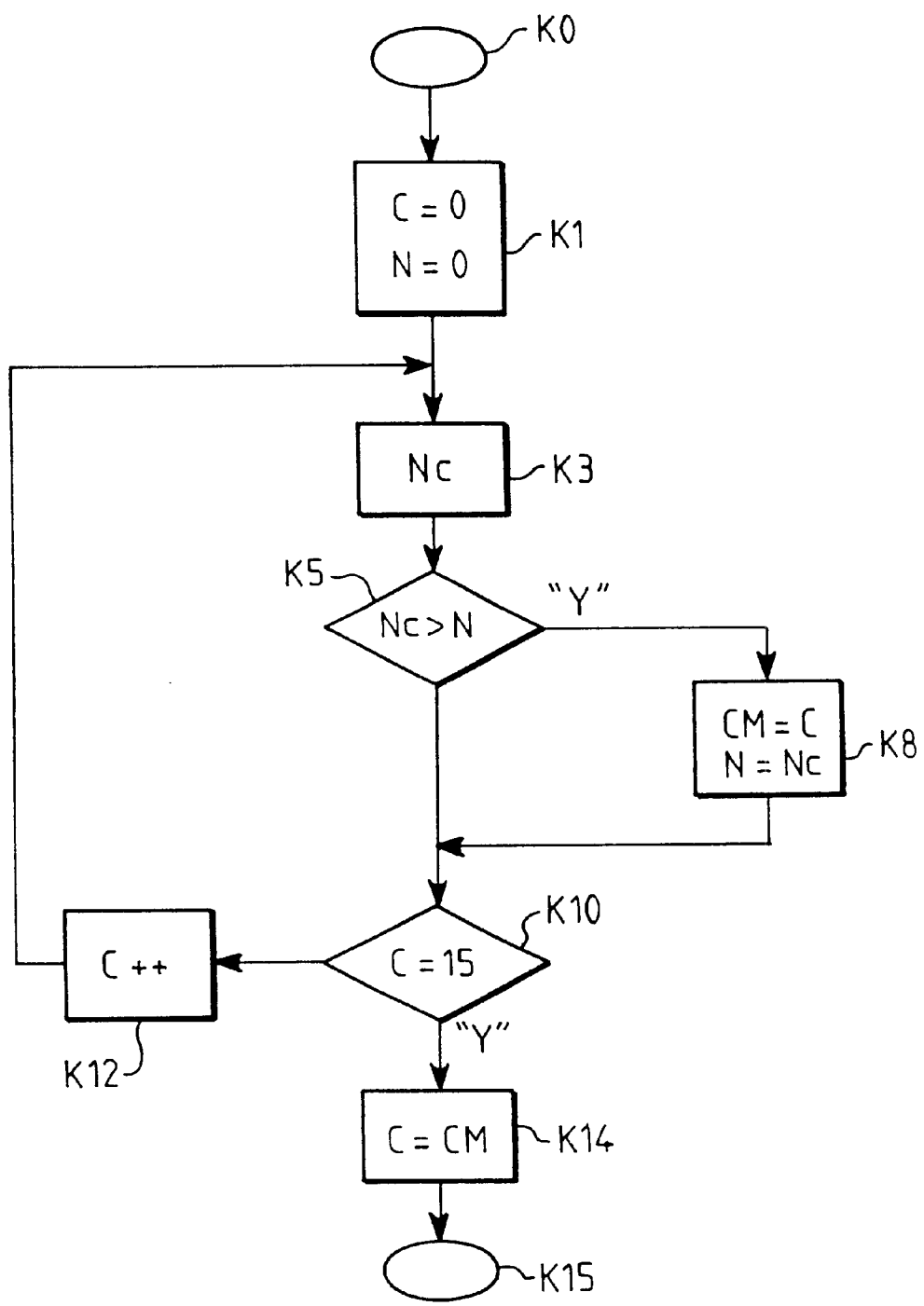
FIG. 3 is a flow chart intended to explain the functioning of the invention.

FIG. 3 is a flow chart that explains the functioning of the invention. Box K0 indicates the input of the adjusting process of the value of the capacitors to be inserted into the oscillating circuit 51. This process is implemented in principle by the microprocessor 92. Box K1 indicates the initialization of two variables: first the variable C which is the contents of the counter 90, that is to say, the contents of this counter 90 are set to zero, and a variable N intended to contain the value of the level measured by the detector 98. In box K3, the value of the detected level is received. This level is due to the emission of the reference emitter 105 started previously. This level is then compared, as indicated in box K5, with the level entered in the variable N. If the level Nc that has just been supplied is higher than the already entered value, the latter value of Nc is stored in the variable N. Furthermore, the value of the contents of the counter 90 is stored in a variable CM (box K8). After the operation carried out in box K8 and if the test indicated in box K9 is negative, a test is made with the contents C of the counter 90. There is tested whether these contents are equal to 15, box K10, which corresponds to a 4-position counter that counts, in binary count, from 0000 to 1111. If the contents of 15 are not obtained, this counter is incremented by unity in box K12. If these contents are equal to 15, the value CM which is thus associated to the highest detected level is set in box K14. Box K15 marks the end of the execution of the program after the operation of box K14. The values C68, C69, C70 and C71 of the capacitors 68, 69, 70 and 71 respectively, are each other's double values such as:

C68=1.CO
C69=2.CO
C70=4.CO
C71=8.CO so that all the values from 0.CO to 15.CO are obtained when the contents of the counter 90 vary from 0 to 15, CO being the basic unit for these several capacitors.

As a variant it is possible that the contents of the counter 90 are stored for various frequencies processed by the reference oscillator 150, so that adjustments can be made to the various carriers the device can receive.

Although capacitors are cited for regulating the oscillation circuit, also reactive elements realized by self-inductances can be used without leaving the scope of the invention.

What is claimed is:

1. A radio device comprising a receiving part formed by at least:
   a frequency selective stage including at least one amplification stage followed by an anti-resonant frequency selective circuit that can be tuned to a certain frequency band,
   a level detector, coupled to an output of the frequency selective stage, for measuring the level of an external reference signal,
   a variation element for causing the frequency band to which the tunable frequency selective circuit is tuned to vary as a function of a control magnitude, said variation element comprising a plurality of reactive elements and a connection network for selectively connecting any one or more of the plurality of reactive elements into the frequency selective circuit in response to the control magnitude,
   a storage element for storing the control magnitude, and a processor arranged to set the stored control magnitude to that which gives the best level obtained by the level detector.

2. A device as claimed in claim 1, wherein the variation element further comprises a counter for alternately connecting each and every combination of one or more, of the reactive elements into the frequency selective circuit, and the control magnitude is the contents of the counter.

3. The radio device as claimed in claim 1, wherein the anti-resonant frequency selective circuit comprises an inductor in parallel with a capacitance, wherein the capacitance is formed by the parallel arrangement of a plurality of capacitors.

4. A method of adjusting at least one frequency selective stage of a receiver, wherein the frequency selective stage includes at least one amplification stage followed by an anti-resonant frequency selective circuit comprising a variation element for causing the frequency band to which the tunable frequency selective circuit is tuned to vary as a function of a control magnitude, said variation element comprising a plurality of reactive elements and a connection network for selectively connecting any one or more of the plurality of reactive elements into the frequency selective circuit, the method comprising the following acts steered by a processor:
   alternate connection via the connection network of each and every combination of one or more of the reactive elements into the anti-resonant frequency selective circuit,
   measurement of the level received from an externally received reference signal, and
   storage of the control magnitude associated with the combination giving the best level.

5. The method as claimed in claim 4, including the step of providing an anti-resonant frequency selective circuit that comprises an inductor in parallel with a capacitance, wherein the capacitance is formed by the parallel arrangement of a plurality of capacitors.

* * * * *